United States Patent
Herner et al.

(10) Patent No.: US 8,404,553 B2
(45) Date of Patent: Mar. 26, 2013

(54) DISTURB-RESISTANT NON-VOLATILE MEMORY DEVICE AND METHOD

(75) Inventors: Scott Brad Herner, San Jose, CA (US); Hagop Nazarian, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 151 days.

(21) Appl. No.: 12/861,666

(22) Filed: Aug. 23, 2010

(65) Prior Publication Data
US 2012/0043520 A1 Feb. 23, 2012

(51) Int. Cl.
*H01L 21/20* (2006.01)
(52) U.S. Cl. ............... 438/382; 365/148; 257/5
(58) Field of Classification Search ........... 257/4, 5; 438/382; 365/148
See application file for complete search history.

(56) References Cited

U.S. PATENT DOCUMENTS

| | | |
|---|---|---|
| 680,652 A | 8/1901 | Elden |
| 4,433,468 A | 2/1984 | Kawamata |
| 4,684,972 A | 8/1987 | Owen et al. |
| 4,741,601 A | 5/1988 | Saito |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |
| 5,614,756 A | 3/1997 | Forouhi et al. |
| 5,714,416 A | 2/1998 | Eichman et al. |
| 5,751,012 A | 5/1998 | Wolstenholme et al. |
| 5,840,608 A | 11/1998 | Chang |

(Continued)

FOREIGN PATENT DOCUMENTS

| | | |
|---|---|---|
| KR | 1020110014248 A | 2/2011 |
| WO | WO 2009/005699 A1 | 1/2009 |

OTHER PUBLICATIONS

Jian Hu et al., "Area-Dependent Switching In Thin Film-Silicon Devices", Materials Research Society, Mal. Res. Soc. Symp Proc., 2003, pp. A18.3.1-A18.3.6, vol. 762.

(Continued)

*Primary Examiner* — Jenny L Wagner
*Assistant Examiner* — Mark Tornow
(74) *Attorney, Agent, or Firm* — Ogawa P.C.

(57) ABSTRACT

A method of forming a disturb-resistant non volatile memory device. The method includes providing a semiconductor substrate having a surface region and forming a first dielectric material overlying the surface region. A first wiring material overlies the first dielectric material, a doped polysilicon material overlies the first wiring material, and an amorphous silicon switching material overlies the said polysilicon material. The switching material is subjected to a first patterning and etching process to separating a first strip of switching material from a second strip of switching spatially oriented in a first direction. The first strip of switching material, the second strip of switching material, the contact material, and the first wiring material are subjected to a second patterning and etching process to form at least a first switching element from the first strip of switching material and at least a second switching element from the second strip of switching material, and a first wiring structure comprising at least the first wiring material and the contact material. The first wiring structure being is in a second direction at an angle to the first direction.

19 Claims, 10 Drawing Sheets

U.S. PATENT DOCUMENTS

| | | | |
|---|---|---|---|
| 5,970,332 A | 10/1999 | Pruijmboom et al. | |
| 5,998,244 A | 12/1999 | Wolstenholme et al. | |
| 6,128,214 A | 10/2000 | Kuekes et al. | |
| 6,143,642 A | 11/2000 | Sur, Jr. et al. | |
| 6,259,116 B1 | 7/2001 | Shannon | |
| 6,291,836 B1 | 9/2001 | Kramer et al. | |
| 6,436,765 B1 | 8/2002 | Liou et al. | |
| 6,436,818 B1 | 8/2002 | Hu et al. | |
| 6,492,694 B2 | 12/2002 | Noble et al. | |
| 6,768,157 B2 | 7/2004 | Krieger et al. | |
| 6,815,286 B2 | 11/2004 | Krieger et al. | |
| 6,838,720 B2 | 1/2005 | Krieger et al. | |
| 6,858,481 B2 | 2/2005 | Krieger et al. | |
| 6,858,482 B2 | 2/2005 | Gilton | |
| 6,864,127 B2 | 3/2005 | Yamazaki et al. | |
| 6,864,522 B2 | 3/2005 | Krieger et al. | |
| 6,927,430 B2 | 8/2005 | Hsu | |
| 6,939,787 B2 | 9/2005 | Ohtake et al. | |
| 6,946,719 B2 | 9/2005 | Petti et al. | |
| 7,020,006 B2 | 3/2006 | Chevallier et al. | |
| 7,023,093 B2 | 4/2006 | Canaperi et al. | |
| 7,026,702 B2 | 4/2006 | Krieger et al. | |
| 7,102,150 B2 | 9/2006 | Harshfield et al. | |
| 7,122,853 B1 | 10/2006 | Gaun et al. | |
| 7,187,577 B1 | 3/2007 | Wang et al. | |
| 7,221,599 B1 | 5/2007 | Gaun et al. | |
| 7,238,607 B2 | 7/2007 | Dunton et al. | |
| 7,254,053 B2 | 8/2007 | Krieger et al. | |
| 7,289,353 B2 | 10/2007 | Spitzer et al. | |
| 7,365,411 B2 | 4/2008 | Campbell | |
| 7,405,418 B2 | 7/2008 | Happ et al. | |
| 7,433,253 B2 | 10/2008 | Gogl et al. | |
| 7,474,000 B2 | 1/2009 | Scheuerlein et al. | |
| 7,479,650 B2 | 1/2009 | Gilton | |
| 7,521,705 B2 | 4/2009 | Liu | |
| 7,534,625 B2 | 5/2009 | Karpov et al. | |
| 7,550,380 B2 | 6/2009 | Elkins et al. | |
| 7,606,059 B2 | 10/2009 | Toda | |
| 7,615,439 B1 | 11/2009 | Schricker et al. | |
| 7,728,318 B2 | 6/2010 | Raghuram et al. | |
| 7,729,158 B2 | 6/2010 | Toda et al. | |
| 7,772,581 B2 | 8/2010 | Lung | |
| 7,778,063 B2 | 8/2010 | Brubaker et al. | |
| 7,786,464 B2 | 8/2010 | Nirschl et al. | |
| 7,786,589 B2 | 8/2010 | Matsunaga et al. | |
| 7,824,956 B2 | 11/2010 | Schricker et al. | |
| 7,829,875 B2 | 11/2010 | Scheuerlein | |
| 7,835,170 B2 | 11/2010 | Bertin et al. | |
| 7,859,884 B2 | 12/2010 | Scheuerlein | |
| 7,875,871 B2 | 1/2011 | Kumar et al. | |
| 7,881,097 B2 | 2/2011 | Hosomi et al. | |
| 7,897,953 B2 | 3/2011 | Liu | |
| 7,898,838 B2 | 3/2011 | Chen et al. | |
| 7,920,412 B2 | 4/2011 | Hosotani et al. | |
| 7,924,138 B2 | 4/2011 | Kinoshita et al. | |
| 7,968,419 B2 | 6/2011 | Li et al. | |
| 8,004,882 B2 | 8/2011 | Katti et al. | |
| 8,018,760 B2 | 9/2011 | Muraoka et al. | |
| 8,045,364 B2 | 10/2011 | Schloss et al. | |
| 8,054,674 B2 | 11/2011 | Tamai et al. | |
| 8,067,815 B2 | 11/2011 | Chien et al. | |
| 8,071,972 B2 | 12/2011 | Lu et al. | |
| 8,088,688 B1 | 1/2012 | Herner | |
| 8,097,874 B2 | 1/2012 | Venkatasamy et al. | |
| 8,102,698 B2 | 1/2012 | Scheuerlein | |
| 8,143,092 B2 | 3/2012 | Kumar et al. | |
| 8,144,498 B2 | 3/2012 | Kumar et al. | |
| 8,164,948 B2 | 4/2012 | Katti et al. | |
| 8,168,506 B2 | 5/2012 | Herner | |
| 8,183,553 B2 | 5/2012 | Phatak et al. | |
| 8,207,064 B2 * | 6/2012 | Bandyopadhyay et al. | 438/683 |
| 8,227,787 B2 | 7/2012 | Kumar et al. | |
| 2004/0026682 A1 | 2/2004 | Jiang | |
| 2005/0020510 A1 | 1/2005 | Benedict | |
| 2005/0029587 A1 | 2/2005 | Harshfield | |
| 2007/0008773 A1 | 1/2007 | Scheuerlein | |
| 2007/0015348 A1 | 1/2007 | Hsu et al. | |
| 2007/0087508 A1 | 4/2007 | Herner | |
| 2007/0105284 A1 | 5/2007 | Herner | |
| 2007/0105390 A1 | 5/2007 | Oh | |
| 2007/0205510 A1 | 9/2007 | Lavoie et al. | |
| 2007/0290186 A1 | 12/2007 | Bourim et al. | |
| 2008/0002481 A1 | 1/2008 | Gogl et al. | |
| 2008/0006907 A1 | 1/2008 | Lee et al. | |
| 2008/0048164 A1 | 2/2008 | Odagawa | |
| 2008/0089110 A1 | 4/2008 | Robinett et al. | |
| 2008/0090337 A1 | 4/2008 | Williams | |
| 2008/0106925 A1 | 5/2008 | Paz de Araujo et al. | |
| 2008/0106926 A1 | 5/2008 | Brubaker et al. | |
| 2008/0206931 A1 | 8/2008 | Breuil et al. | |
| 2009/0001345 A1 | 1/2009 | Schricker et al. | |
| 2009/0014707 A1 | 1/2009 | Lu et al. | |
| 2009/0052226 A1 | 2/2009 | Lee et al. | |
| 2009/0168486 A1 | 7/2009 | Kumar | |
| 2009/0231910 A1 | 9/2009 | Liu et al. | |
| 2009/0250787 A1 | 10/2009 | Kutsunai | |
| 2009/0256130 A1 | 10/2009 | Schricker | |
| 2009/0298224 A1 * | 12/2009 | Lowrey | 438/102 |
| 2009/0321789 A1 | 12/2009 | Wang et al. | |
| 2010/0012914 A1 | 1/2010 | Xu et al. | |
| 2010/0019310 A1 | 1/2010 | Sakamoto | |
| 2010/0032638 A1 | 2/2010 | Xu | |
| 2010/0084625 A1 | 4/2010 | Wicker et al. | |
| 2010/0085798 A1 | 4/2010 | Lu et al. | |
| 2010/0090192 A1 | 4/2010 | Goux et al. | |
| 2010/0101290 A1 | 4/2010 | Bertolotto | |
| 2010/0102290 A1 | 4/2010 | Lu et al. | |
| 2010/0157710 A1 | 6/2010 | Lambertson et al. | |
| 2010/0176368 A1 | 7/2010 | Ko et al. | |
| 2010/0219510 A1 | 9/2010 | Scheuerlein et al. | |
| 2010/0321095 A1 | 12/2010 | Mikawa et al. | |
| 2011/0133149 A1 | 6/2011 | Sonehara | |
| 2011/0155991 A1 * | 6/2011 | Chen | 257/4 |
| 2011/0198557 A1 * | 8/2011 | Rajendran et al. | 257/4 |
| 2011/0212616 A1 | 9/2011 | Seidel et al. | |
| 2011/0227028 A1 | 9/2011 | Sekar et al. | |
| 2011/0284814 A1 | 11/2011 | Zhang | |
| 2011/0317470 A1 | 12/2011 | Lu et al. | |
| 2012/0008366 A1 | 1/2012 | Lu | |
| 2012/0012806 A1 | 1/2012 | Herner | |
| 2012/0015506 A1 | 1/2012 | Jo et al. | |
| 2012/0025161 A1 | 2/2012 | Rathor et al. | |
| 2012/0033479 A1 | 2/2012 | Delucca et al. | |
| 2012/0043519 A1 | 2/2012 | Jo et al. | |
| 2012/0043654 A1 | 2/2012 | Lu et al. | |
| 2012/0104351 A1 * | 5/2012 | Wei et al. | 257/4 |
| 2012/0145984 A1 | 6/2012 | Rabkin et al. | |
| 2012/0155146 A1 | 6/2012 | Ueda et al. | |
| 2012/0235112 A1 | 9/2012 | Huo et al. | |

OTHER PUBLICATIONS

André Dehon, "Array-Based Architecture for FET-Based, Nanoscale Electronics", IEEE Transactions on Nanotechnology, Mar. 2003, pp. 23-32, vol. 2, No. 1, IEEE.

Herb Goronkin et al., "High-Performance Emerging Solid-State Memory Technologies", MRS Bulletin, www.mrs.org/publications/bulletin, Nov. 2004, pp. 805-813.

Gerhard Müller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60, 1983, pp. 1273-1280, North Holland Publishing Company/Physical Society of Japan.

J. Campbell Scott, "Is There an Immortal Memory?", www.sciencemag.org, Apr. 2, 2004, pp. 62-63, vol. 304 No. 5667, American Association for the Advancement of Science.

S.H. Lee et al., "Full Integration and Cell Characteristics for 64Mb Nonvolatile PRAM", 2004 Symposium on VLSI Technology Digest of Technical Papers, IEEE, 2004, pp. 20-21.

Stephen Y. Chou et al., "Imprint Lithography With 25-Nanometer Resolution", Science, Apr. 5, 1996, pp. 85-87, vol. 272, American Association for the Advancement of Science.

S. Zankovych et al., "Nanoimprint Lithography: challenges and prospects", Nanotechnology, 2001, pp. 91-95, vol. 12, Institute of Physics Publishing.

A. Avila et al., "Switching in coplanar amorphous hydrogenated silicon devices", Solid-State Electronics, 2000, pp. 17-27, vol. 44, Elsevier Science Ltd.
Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.
S. Hudgens et al., "Overview of Phase-Change Chalcogenide Nonvolatile Memory Technology", MRS Bulletin, www.mrs.org/publications/bulletin, Nov. 2004, pp. 829-832.
K. Terabe et al., "Quantized conductance atomic switch", Nature, www.nature.com/nature, Jan. 6, 2005, pp. 47-50, vol. 433, Nature Publishing Group.
Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystalline Solids, 1985, pp. 1373-1382, vol. 77 & 78, Elsevier Science Publishers B.V., North Holland Physics Publishing Division, North-Holland, Amsterdam.
A. E. Owen et al., "Switching in amorphous devices", Int. J. Electronics, 1991, pp. 897-906, vol. 73, No. 5, Taylor and Francis Ltd.
M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, pp. 1-4.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resisitive Switching Nonvolatile Memory", IEEE, 2008.
Sung Hyun Jo et al., "Nanoscale Memristor Device as Synapse in Neuromorphic Systems", Nano Letters, pubs.acs.org/NanoLett, pp. A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", $9^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24, No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/p*a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. 1, No. 2.
J. Hajto et al., "Electronic Switching in Amorphous-Semiconductor Thin Films", Chapter 14, pp. 640-701.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile A-Si:H Memory Devices", pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.

J. Suñé et al., "Nondestructive multiple breakdown events in very thin SiO$_2$ films", Applied Physics Letters, 1989, pp. 128-130, vol. 55.

Herve Marand et al., MESc. 5025 lecture notes: Chapter 7. Diffusion, University of Vermont, http://www.files.chem.vt.edu/chem-dept/marand/MEScchap6-1c.pdf.

A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.

Sung Hyun Jo, "Nanoscale Memristive Devices for Memory and Logic Applications", Ph. D dissertation, University of Michigan, 2010.

Office Action for U.S. Appl. No. 12/894,098 dated Aug. 1, 2012.

Sung Hyun Jo et al., "CMOS Compatible Nanoscale Nonvolatile Resistance Switching Memory", Nano Letters, 2008, pp. 392-397, vol. 8, No. 2.

Office Action for U.S. Appl. No. 12/582,086 dated Apr. 19, 2011.

Office Action for U.S. Appl. No. 12/582,086 dated Sep. 6, 2011.

Notice of Allowance for U.S. Appl. No. 12/582,086 dated Oct. 21, 2011.

International Search Report for PCT/US2009/061249 filed on Oct. 20, 2009.

Written Opinion of the International Searching Authority for PCT/US2009/061249 filed on Oct. 20, 2009.

Office Action for U.S. Appl. No. 12/814,410 dated Apr. 17, 2012.

Office Action for U.S. Appl. No. 12/835,699 dated Aug. 24, 2011.

Notice of Allowance for U.S. Appl. No. 12/835,699 dated Feb. 6, 2012.

Office Action for U.S. Appl. No. 12/833,898 dated Apr. 5, 2012.

European Search Report for Application No. EP 1100 5207.3 of Oct. 12, 2011.

Notice of Allowance for U.S. Appl. No. 12/833,898 dated May 30, 2012.

Notice of Allowance for U.S. Appl. No. 12/939,824 dated May 11, 2012.

Notice of Allowance for U.S. Appl. No. 12/940,920 dated Oct. 5, 2011.

Office Action for U.S. Appl. No. 13/314,513 dated Mar. 27, 2012.

Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.

Office Action for U.S. Appl. No. 13/149,653 dated Apr. 25, 2012.

International Search Report for PCT/US2011/045124 filed on Jul. 22, 2011.

Written Opinion of the International Searching Authority for PCT/US2011/045124 filed on Jul. 22, 2011.

Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.

J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.

Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.

Notice of Allowance for U.S. Appl. No. 12/939,824 dated Jul. 24, 2012.

Office Action for Application No. EP 1100 5207.3 dated Aug. 8, 2012.

Office Action for U.S. Appl. No. 12/861,650 dated Oct. 16, 2012.

Notice of Allowance for U.S. Appl. No. 12/894,087 dated Oct. 25, 2012.

Notice of Allowance for U.S. Appl. No. 13/149,807 dated Oct. 29, 2012.

Office Action for U.S. Appl. No. 13/156,232, dated Nov. 26, 2012.

Notice of Allowance for U.S. Appl. No. 13/290,024 dated Nov. 28, 2012.

Office Action for U.S. Appl. No. 13/417,135 dated Oct. 9, 2012.

Notice of Allowance for U.S. Appl. No. 13/532,019 dated Nov. 14, 2012.

Office Action for U.S. Appl. No. 13/149,653 dated Nov. 20, 2012.

Office Action of U.S. Appl. No. 13/436,714 dated Dec. 7, 2012.

Notice of Allowance for U.S. Appl. No. 12/814,410 dated Jan. 8, 2013.

Supplemental Notice of Allowance for U.S. Appl. No. 12/894,087 dated Jan. 11, 2013.

Notice of Allowance for U.S. Appl. No. 13/314,513 dated Jan. 24, 2013.

Notice of Allowance for U.S. Appl. No. 13/118,258, dated Feb. 6, 2013.

International Search Report and Written Opinion for PCT/US2012/040242, dated Jan. 31, 2013.

\* cited by examiner

US 8,404,553 B2

DISTURB-RESISTANT NON-VOLATILE MEMORY DEVICE AND METHOD

CROSS REFERENCE TO RELATED APPLICATIONS

Not Applicable

BACKGROUND

The present invention is generally related to resistive switching devices. More particularly, embodiments according to the present invention provide a method and a structure for forming a vertical resistive switching device. The present invention can be applied to non-volatile memory devices but it should be recognized that the present invention can have a much broader range of applicability The success of semiconductor devices has been mainly driven by an intensive transistor down-scaling process. However, as field effect transistors (FET) approach sizes less than 100 nm, problems such as short channel effect can degrade device performance. Moreover, such sub 100 nm device size can lead to sub-threshold slope non-scaling and also increases power dissipation. It is generally believed that transistor-based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Power dissipation during switching for a PCRAM device is usually large. Organic RAM or ORAM is incompatible with large volume silicon-based fabrication and device reliability is usually poor.

From the above, a new semiconductor device structure and integration is desirable.

BRIEF SUMMARY OF THE PRESENT INVENTION

The present invention is directed to switching devices. More particularly, embodiments according to the present invention provide a method and a structure to form an array of switching devices. The present invention has be applied to forming a disturb-resistant non-volatile memory device using an amorphous silicon switching material. But it should be recognized that embodiments of the present invention can be applied to other devices.

In a specific embodiment, a method of forming a disturb-resistant non-volatile memory device is provided. The method includes providing a substrate having a surface region and forming a first dielectric material overlying the surface region of the substrate. A first wiring material is formed overlying the first dielectric material and a contact material comprising a p+ doped polysilicon material is formed overlying the first wiring material. The method forms a switching material comprising an amorphous silicon material overlying the contact material. In a specific embodiment, the method includes subjecting the switching material to a first pattering and etching process to separating a first strip of switching material from a second strip of switching material. The first strip of switching material and the second strip of switching material are spatially oriented in a first direction in a specific embodiment. The method then subjects the first strip of switching material, the second strip of switching material, the contact material, and the first wiring material to a second patterning and etching process. The second patterning and etching process cause formation of at least a first switching element from the first strip of switching material and at least a second switching element from the second strip of switching material, and a first wiring structure comprising at least the first wiring material and the contact material. In a specific embodiment, the first wiring structure is configured to extend in a second direction at an angle to the first direction.

In a specific embodiment, a method of forming a disturb-resistant non volatile memory device is provided. The method includes providing a first cell and a second cell. The first cell includes a first wiring structure, a second wiring structure, a contact material overlying the first wiring structure and a switching material overlying the contact material. In a specific embodiment, the first wiring structure is configured to extend in a first direction and a second wiring structure extending in a second direction orthogonal to the first direction. In a specific embodiment, the switching material includes an amorphous silicon material and the contact material comprising a p+ polysilicon material. In a specific embodiment, the first cell includes a first switching region formed in an intersecting region between the first wiring structure and the second wiring structure and a contact region between the switching first wiring structure and the switching region. In a specific embodiment, the second cell is formed from the first wiring structure, the switching material, the contact material, and a third wiring structure. The third wiring structure is configured parallel to the second wiring structure in a specific embodiment. A second switching region is formed in an intersecting region between the first wiring structure and the third wiring structure. In a specific embodiment, at least the switching material forms a coupling between the first cell and the second cell. In a specific embodiment, the coupling is eliminated at least by removing a portion of the switching material to form a void region. The void region is filled using a dielectric material to electrically and physically isolate at least the first switching region and the second switching region. In other implementation, a first void region can further be formed between the first contact region and the second region. The dielectric material fills the void region and the first void region to electrically and physically isolate the first switching region form the second switching region, and to electrically and physically the first contact region from the second contact region in a specific embodiment.

In a specific embodiment, a non-volatile memory device is provided. The device includes a substrate having a surface region and a first dielectric material overlying the surface region of the semiconductor substrate. The device includes at least a first cell and a second cell. In a specific embodiment, the first cell includes a first wiring structure extending in a first direction overlying the first dielectric material. A first contact region overlies the first wiring structure and a first switching region overlies the first contact region. The first contact region includes a p+ polysilicon material and the first switching region includes an amorphous silicon material in a specific embodiment. The first cell includes a second wiring structure extending in a second direction orthogonal to the first direction overlying the switching region. The second cell includes a second contact region comprising the p+ polysilicon material overlying the first wiring structure. A second switching region comprising the amorphous silicon material overlies the second contact region. The second cell includes a third wiring structure overlying the second switching region. The third wiring structure is separated from the second wiring structure and parallel to the second wiring structure. In a specific embodiment, a dielectric material is disposed at least in a region between the first switching region and the second switching region to electrically and physically isolate the first switching region and the second switching region. In other embodiment, the dielectric material is further disposed between a first region between the first contact region and the second contact region to further electrically and physically isolate the first contact region and the second region.

Many benefits can be achieved by ways of present invention. The present invention uses convention CMOS fabrication techniques to form a disturb resistant non-volatile memory array. Embodiments according to the present invention further provide an array of interconnected switching devices to be used in a high density memory device. Depending on the embodiment, one or more of these benefits can be achieved. One skilled in the art would recognize other variations, modifications, and alternatives.

DETAILED DESCRIPTION OF THE PRESENT INVENTION

The present invention is generally related to switching devices. More particularly, embodiments according to the present invention provide a method and a structure to form an array of switching devices. The present invention has be applied to forming a disturb resistant non-volatile memory device using an amorphous silicon switching material. But it should be recognized that embodiments of the present invention can be applied to other devices.

Figure 1:
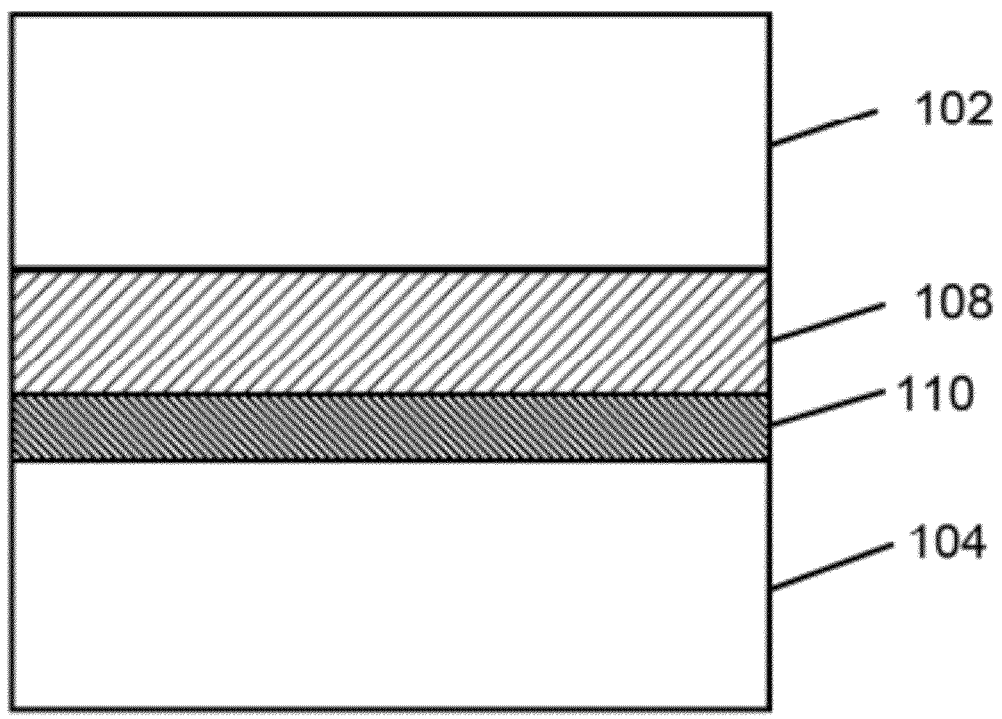
FIG. 1 is a simplified diagram illustrating a resistive switching device according to an embodiment of the present invention.

FIG. 1 is a simplified diagram illustrating a cross section of a resistive switching device 100. The resistive switching device includes a top wiring structure 102, a bottom wiring structure 104 and a switching element 108 disposed between the top wiring structure and the bottom wiring structure. The top electrode and the bottom electrode are arranged orthogonal to each other in a crossbar to form a highly interconnected structure. In this implementation, the top wiring structure and the bottom wiring structure can have a portion including a conductor material such as tungsten, copper, or aluminum that are commonly used in CMOS processing. The top wiring structure further includes a metal material in contact with the switching element. For a switching element using an amorphous silicon material, the metal material can be silver or other suitable metal materials. Other suitable metal materials can include gold, platinum, palladium, and others, depending on the application. The silver material can be formed in a via structure connecting the amorphous silicon switching material to other portion of the top wiring structure. Again, for an amorphous silicon switching material, the bottom electrode can include a buffer layer 110 between the wiring material and the switching material to provide desirable switching characteristics upon application of a voltage or a current to the top electrode or the bottom electrode. The buffer layer can be a doped silicon material such as a p+ doped polysilicon in a specific embodiment.

Figure 2:
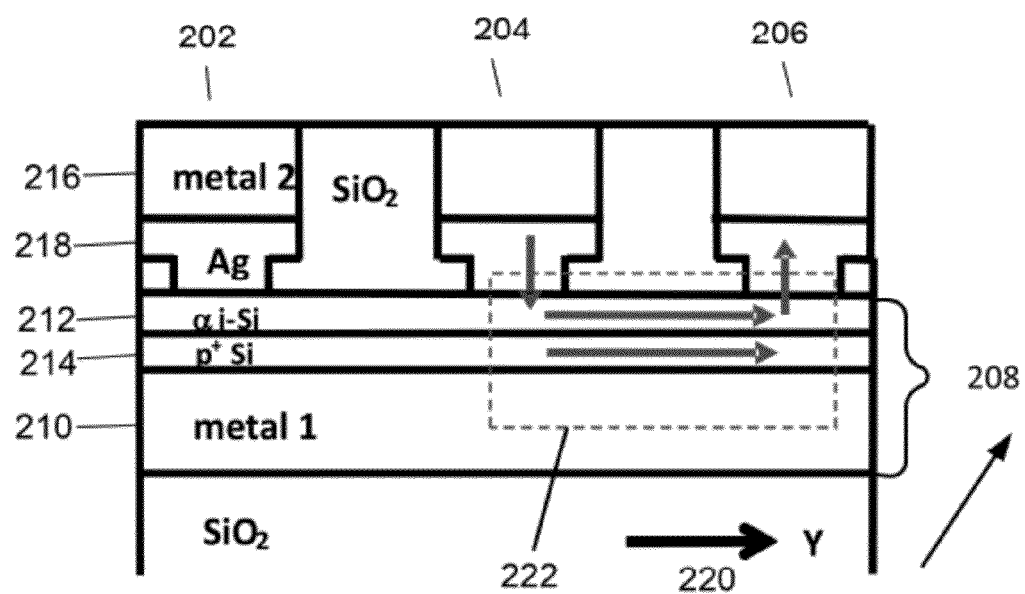
FIG. 2 is a simplified diagram illustrating a conventional method of fabricating an array of switching devices.

FIG. 2 illustrates three interconnected switching devices 202, 204, and 206, formed using a conventional method. As shown, each of the switching devices has a bottom stack 208 including a bottom electrode 210, amorphous silicon layer 212 and p+ polysilicon layer 214 disposed in a first direction 220. The top electrode 216 including silver material 218 is formed orthogonal to the bottom stack. In a specific embodiment, silver material 218 is disposed in a via structure in direct contact with the amorphous silicon material. For this structure, a parasitic leakage path 222 can form between adjacent cells in the first direction during read, write, or erase cycles and cause cross-talk between adjacent cells as shown.

Embodiments of the present invention provide a method and a structure to form non-volatile memory device having a silver/amorphous silicon material/bottom electrode configuration. The present method and structure provide a device that is resistant to cross talk or disturb between adjacent cells in.

Figure 3:
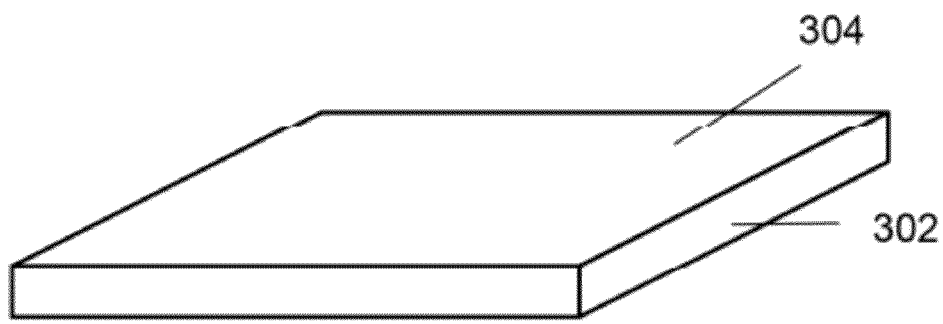
FIGS. 3-13 are simplified diagrams illustrating a method of forming a disturb resistant memory device according to an embodiment of the present invention.

FIGS. 3-12 are simplified diagrams illustrating a method of forming a non-volatile memory device according to embodiments of the present invention. As shown in FIG. 3, the method includes a semiconductor substrate 302 having a surface region 304. The semiconductor substrate can be a silicon material, a silicon germanium substrate, silicon on insulator substrate, or others, depending on the application. In a specific embodiment, the substrate can also include one or more transistor devices formed thereon. The one or more transistor devices are operably coupled to the memory devices and control the memory devices in certain embodiment.

Figure 4:
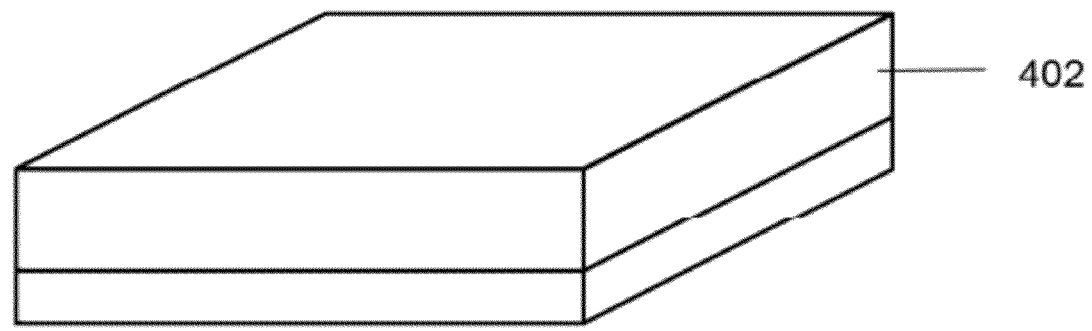

The method includes forming a first dielectric material 402 overlying the surface region of the substrate as shown in FIG. 4. The first dielectric material can be silicon dioxide, silicon nitride, low K dielectric, or a dielectric stack such as silicon oxide on silicon nitride on silicon oxide, commonly known as ONO, depending on the application. The first dielectric material can be formed using techniques such as chemical vapor deposition; including plasma enhanced chemical vapor deposition, physical vapor deposition or a combination depending on the application.

Figure 5:
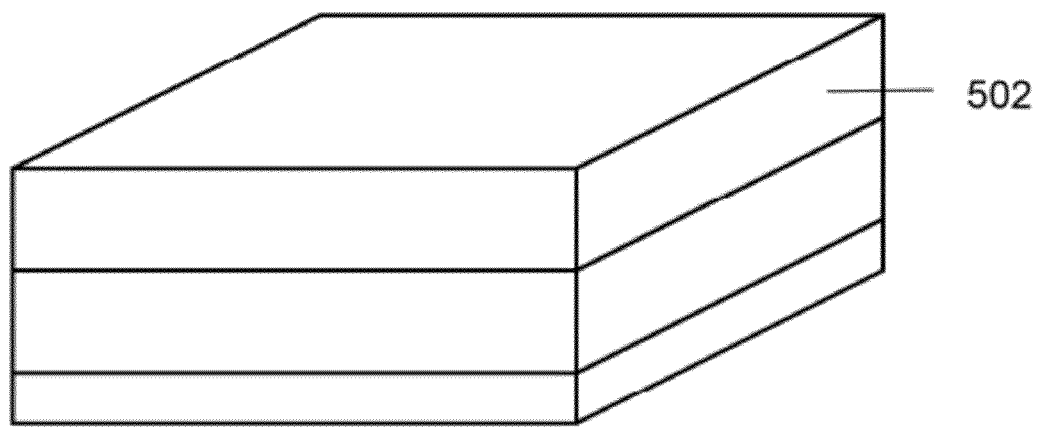

Referring to FIG. 5, the method includes forming a first wiring material 502 overlying the first dielectric material. The first wiring material can include common metal materials used in CMOS processing, such as tungsten, copper, or aluminum. The first wiring material can further include one or more adhesion layer or diffusion barrier layer between the metal material and the first dielectric layer in a specific embodiment. The adhesion layer or diffusion barrier layer can be titanium, titanium nitride, tungsten nitride, or others depending on the embodiment.

Figure 6:
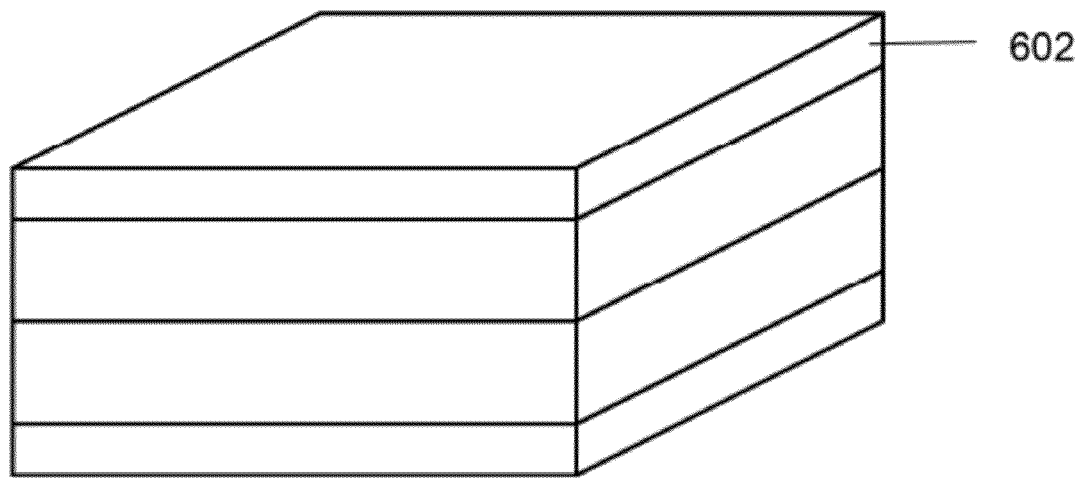

As shown in FIG. 6, the method includes depositing a contact material 602 comprising a silicon material overlying the first wiring material. The silicon material can be a p+ polysilicon material in a specific embodiment. The p+ polysilicon material can be deposited using techniques such as chemical vapor deposition and precursor such as silane, disilane, or a suitable chlorosilane, and boron as a dopant in a specific embodiment. Deposition temperature can range from about 400 Degree Celsius to about 750 Degree Celsius depending on the process and precursors used. Depending on the application, the contact material can be optional.

Figure 7:
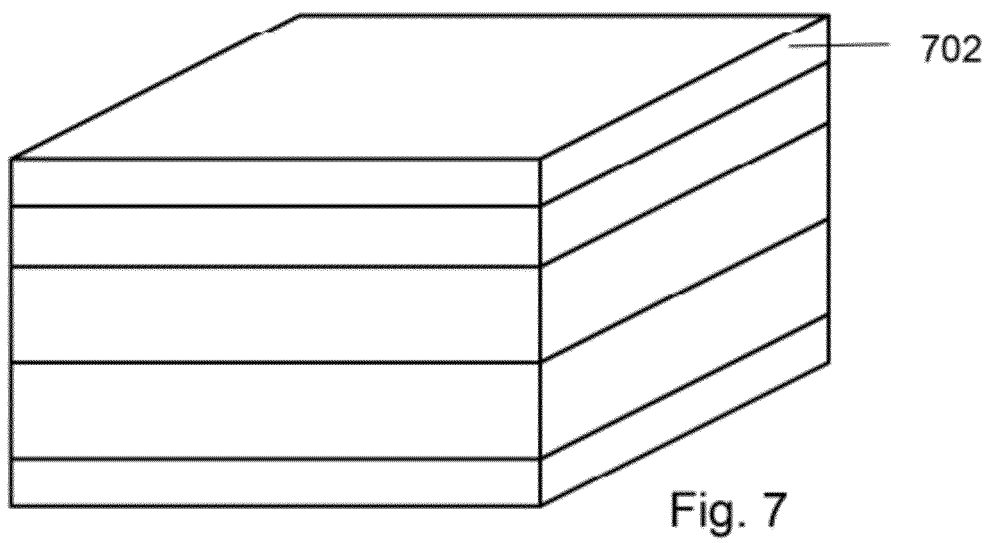

The method includes forming a switching material 702 overlying the contact material as shown in FIG. 7. In a specific embodiment, the switching material comprises an amorphous silicon material. The amorphous silicon material can be deposited using techniques such as chemical vapor deposition and precursor such as silane, disilane, or a suitable chlorosilane in a specific embodiment. Deposition temperature is usually maintained between 250 Degree Celsius to about 500 Degree Celsius depending on the embodiment. In a specific embodiment, the p+ polysilicon material prevents an interfacial region to form between the amorphous silicon material and the first conductor material. The interface region can have an excessive defect sites, affecting proper switching.

Figure 8:
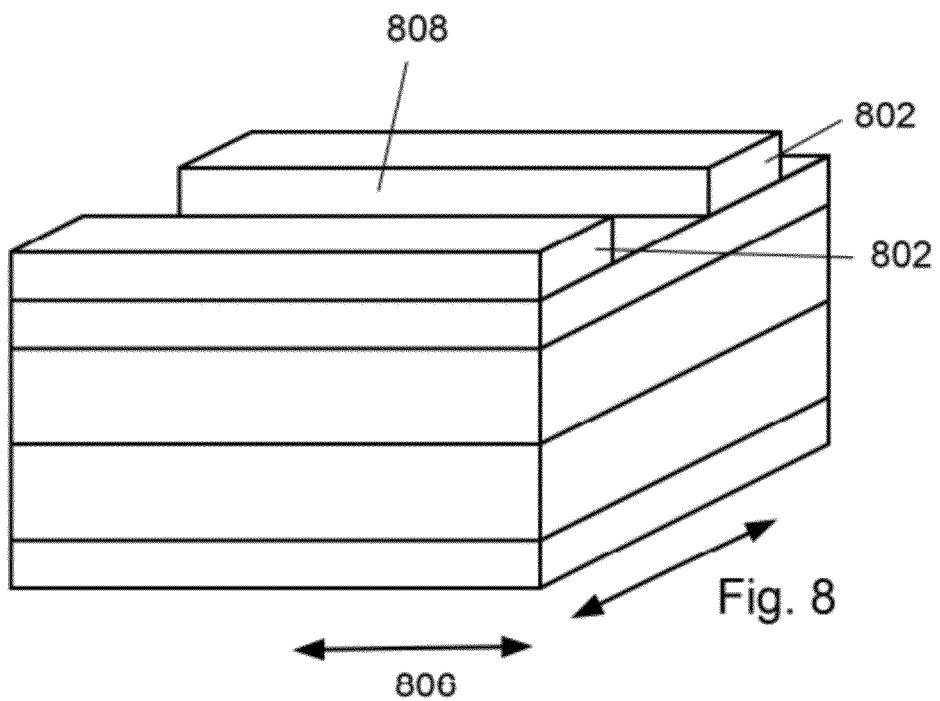

In a specific embodiment, the method includes subjects the amorphous silicon material to a first pattern and etch process to form a plurality of strips of amorphous silicon material 802 as shown in FIG. 8. As shown, each of the strips of amorphous silicon material is extended in a first direction 806 and separated by a first opening region 808. Each of the plurality of strips of amorphous silicon material is spatially parallel to each other in a specific embodiment.

Figure 9:
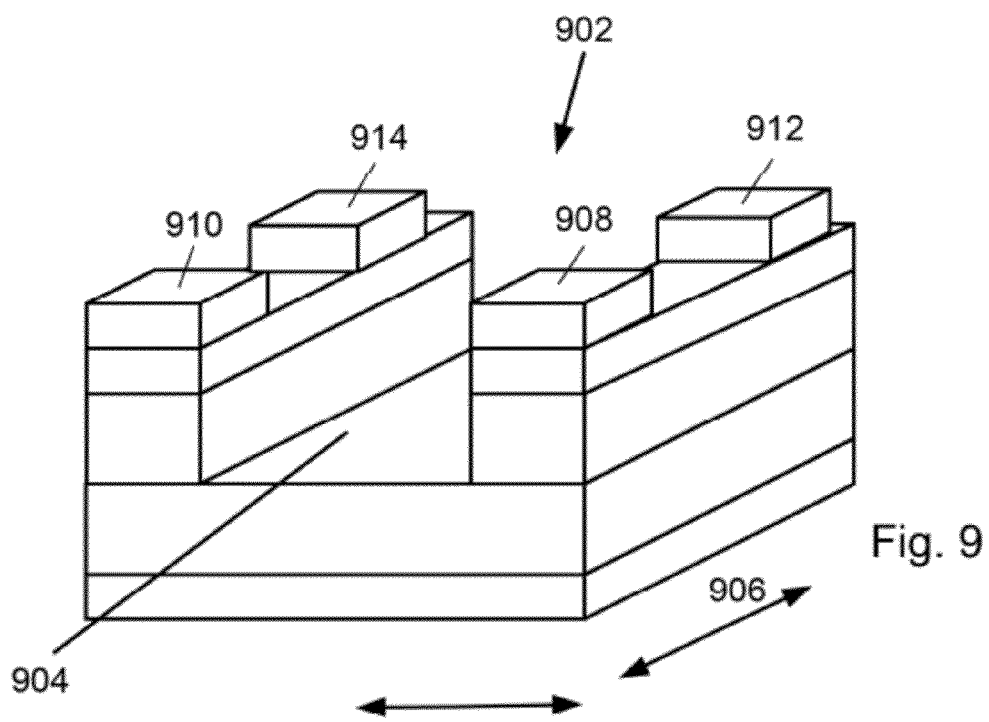

In a specific embodiment, a second pattern and etch process is performed to remove a stack of materials comprise of amorphous silicon material, a portion of the polysilicon material and a portion of the first wiring material to form a second opening region 902 as shown in FIG. 9. As shown, the second opening region includes a trench structure 904 and a portion of the first opening region. The trench structure is configured in a second direction 906 at an angle to the first direction. The second direction is orthogonal to the first direction in a specific embodiment though other angles may also be used. As shown, the first pattern and etching process and the second pattern and etching process cause formation of a first switching element 908 associated with a first switching device, a second switching element 910 associated with a second switching device, a third switching element 912 associated with a third switching device, and a fourth switching element 914 associated with a fourth switching device.

Figure 10:
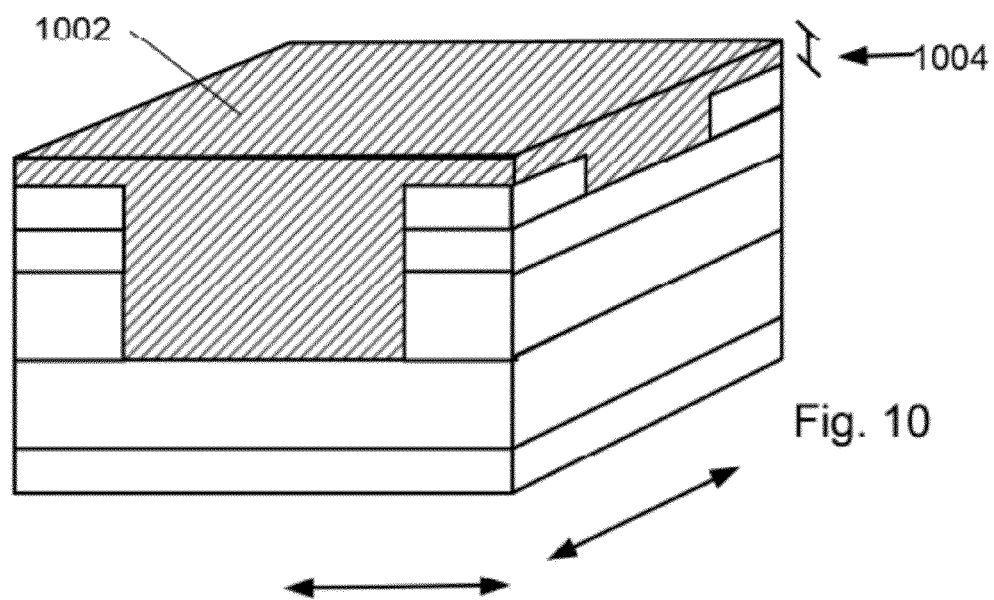

Referring to FIG. 10, the method includes forming a third dielectric material 1002 to fill the second opening region. As shown the first switching element and the second element are isolated by at least the third dielectric material in the first opening region in the first direction in a specific embodiment. In a specific embodiment, the third dielectric material further forms a thickness 1004 overlying each of the switching elements in a specific embodiment. The third dielectric material can be silicon oxide in a specific embodiment. Other suitable dielectric materials such as silicon nitride can also be used. As shown, the third dielectric material isolates neighboring amorphous switching element and prevent parasitic leakage path to form from the amorphous silicon material in a specific embodiment. One skilled in the art would recognize other modifications, variations, and alternatives.

Figure 11:
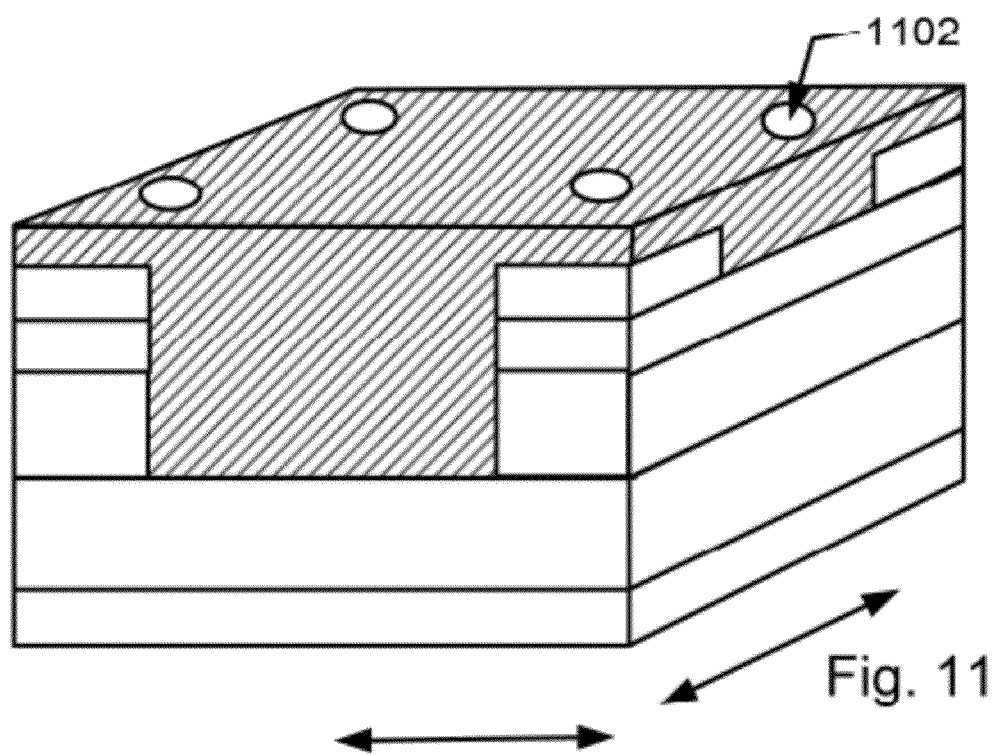

Referring to FIG. 11, the method subjects the third dielectric material to a third pattern and etch process to form a plurality of openings 1102 in a portion of the thickness of the third dielectric layer overlying each of the switching element in a specific embodiment. Optionally, the third dielectric material is subjected to a planarizing process prior to the third patterning and etching process. The third patterning and etching process exposes a top surface region of the switching material in a specific embodiment.

Figure 12:
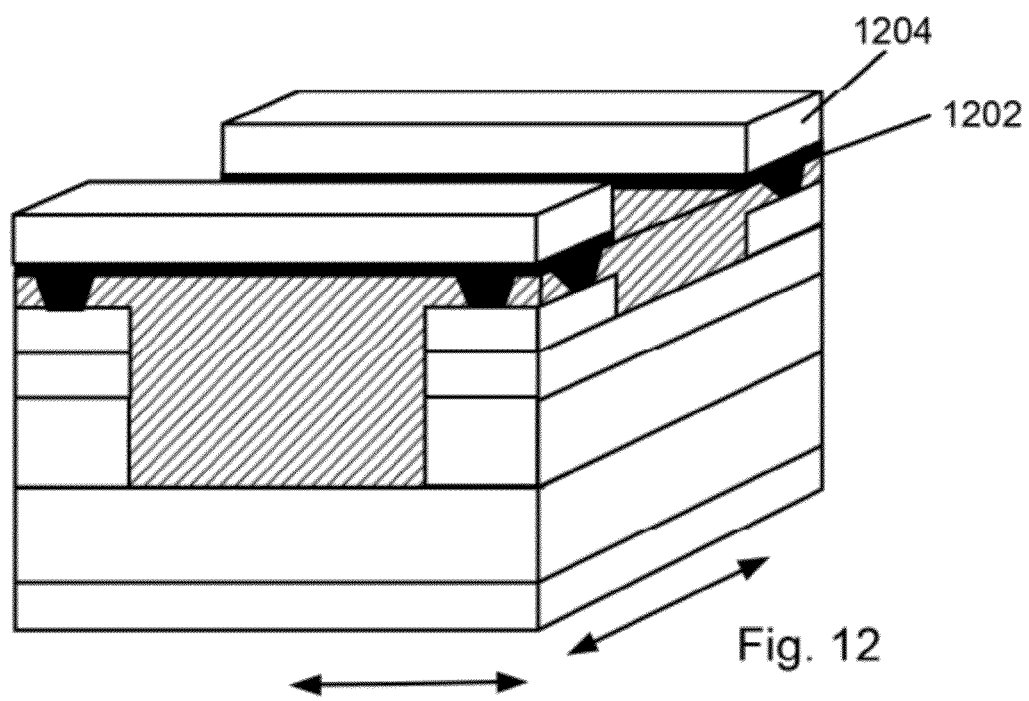

Referring to FIG. 12, the method includes forming a metal material 1202 overlying at least each of the plurality of openings. In a specific embodiment, the metal material at least partially fills each of the plurality of openings to form a contact with the switching material in a specific embodiment. The metal material is selected to have a suitable diffusion characteristic in the amorphous silicon material in a specific embodiment. Depending on the application, the metal material can be silver, gold, platinum, palladium, aluminum, among others. In a specific embodiment, the metal material is a silver material. A second wiring material 1204 is deposited overlying the metal material. The second wiring material can be a conductor material commonly used in CMOS fabrication. Examples of the conductor material are copper, aluminum, tungsten, including a combination, depending on the embodiment. In a specific embodiment, the second wiring material and the metal material are subjected to a fourth pattern and etch process to form a second wiring structure 1204. Second wiring structure includes metal material 1202 in a specific embodiment.

Figure 13:
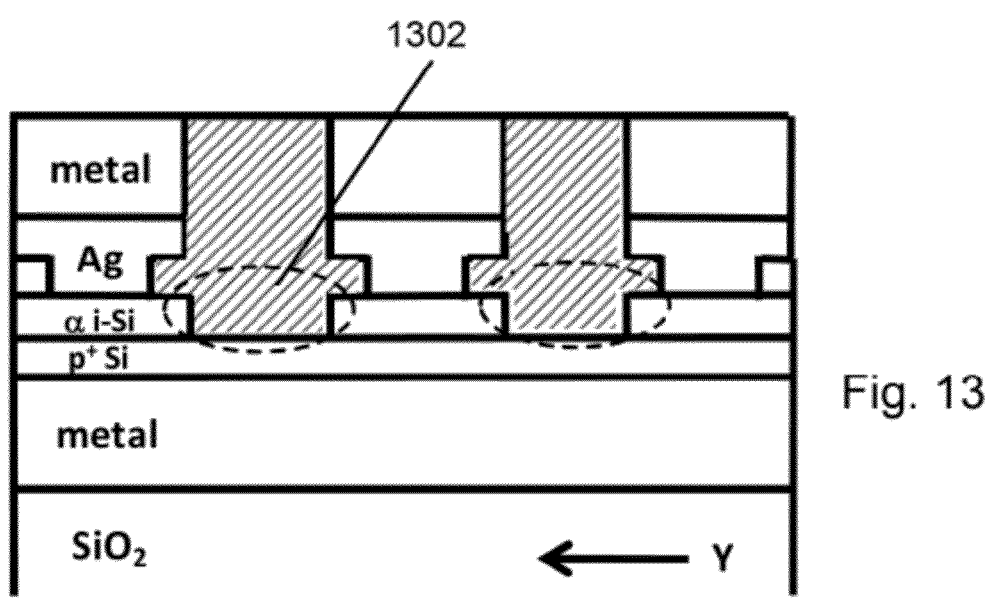

FIG. 13 is a cross sectional view of the non-volatile memory device in the second direction. As shown, the amorphous silicon switching elements is insulated from a neighboring switching element by portions 1302 of third dielectric material 1002, preventing disturb during operations in a specific embodiment.

Figure 14:
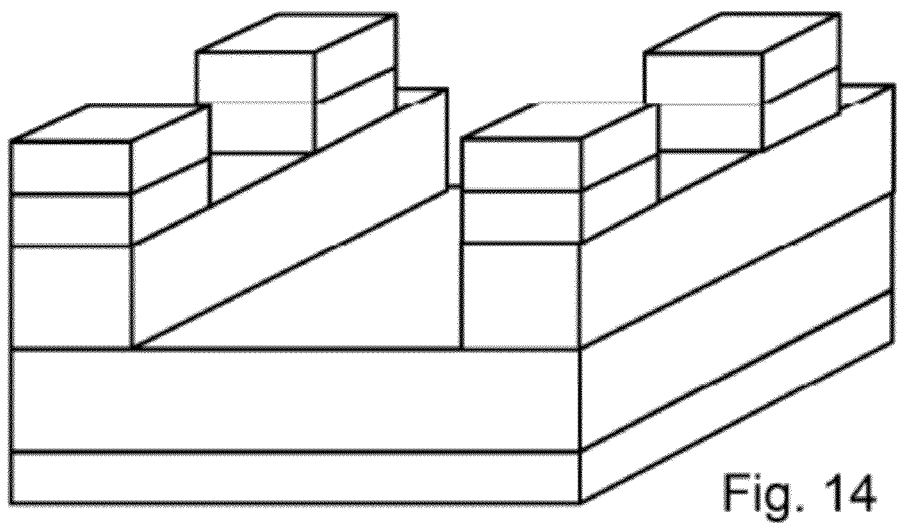
FIGS. 14-16 are simplified diagrams illustrating an alternative method of forming a disturb resistant memory device according to an embodiment of the present invention.
Figure 15:
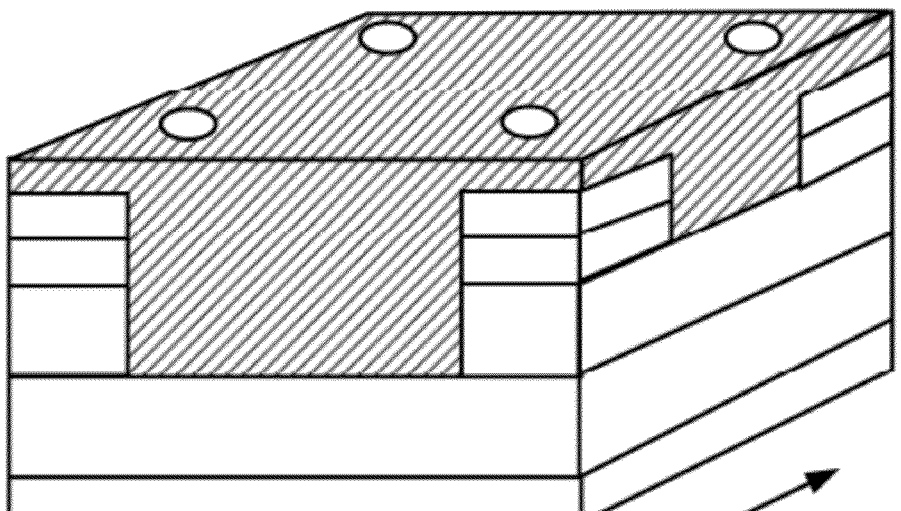
Figure 16:
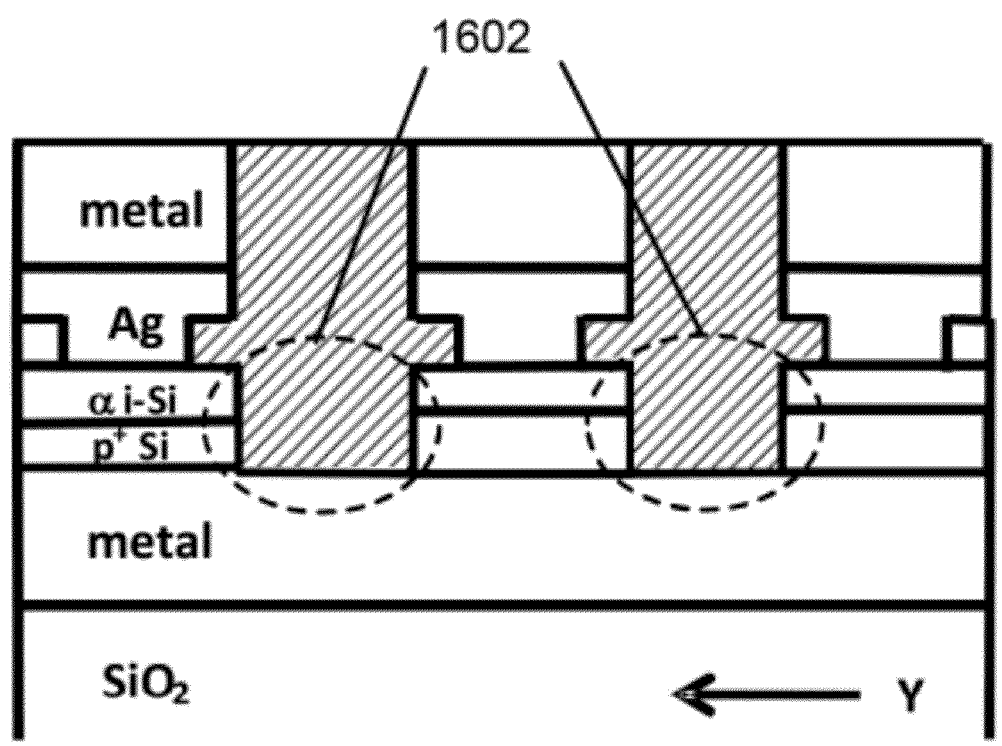

Depending on the embodiment, there can be other variations. For example, as shown in FIGS. 14-15, the first etching process can further remove the p+ polysilicon material in addition to the amorphous silicon material in a specific embodiment. This is more practical as the metal surface can be an effective etch stop for the first etching process. As shown in FIG. 16, the third dielectric material provides isolation 1602 to both the p+ polysilicon material and the amorphous silicon material between neighboring resistive switching devices in the first direction as illustrated in FIG. 16.

In a specific embodiment, a method of forming a non-volatile memory device is provided. The method includes providing a first cell and a second cell in an N by M array of interconnected crossbar structures. The first cell includes a first wiring structure extending in a first direction and a second wiring structure extending in a second direction. The first direction and the second direction are at angle to each other. In a specific embodiment, the first wiring structure is configured to be orthogonal to the second wiring structure, forming a crossbar structure. In a specific embodiment, the first cell includes a contact material overlying the first wiring structure and a switching material overlying the contact material. In a specific embodiment, the contact material can be a p+ polysilicon material and the switching material can include an amorphous silicon material. The first call includes a first amorphous silicon switching region disposed in an intersecting region between the first wiring structure and the second wiring structure in a specific embodiment. In a specific embodiment, the second cell In a specific embodiment, the second cell is formed from the first wiring structure, the switching material, the contact material, and a third wiring structure. The third wiring structure is parallel to the second wiring structure and separated from the second wiring structure in a specific embodiment. In a specific embodiment, a second switching region is dispose in an intersecting region between the first wiring structure and the third wiring structure. At least the switching material and the contact material form a coupling between the first cell and the second cell. The coupling is eliminated by removing a portion of the switching material and the contact material to form a void region between the first cell and the second cell. In a specific embodiment, the void region is filled using a dielectric material to electrically and physically isolate at least the first switching region and the second switching region. The dielectric material prevents disturb between the first cell and the second cell in a specific embodiment as illustrated in FIGS. 13 and 16.

In a specific embodiment, a non-volatile memory device is provided. The device includes a substrate having a surface region. A first dielectric material overlying the surface region of the semiconductor substrate. The device includes at least a first cell and a second cell. The first cell and the second cell are provided in an array of N by M interconnected crossbar structure in a specific embodiment. The first cell includes a first wiring structure extending in a first direction overlying the first dielectric material, a first contact region comprising a p+ polysilicon material, a first switching region comprising an amorphous silicon material, and a second wiring structure extending in a second direction orthogonal to the first direction in a specific embodiment. The second cell includes the first wiring structure, a second contact region comprising the p+ polysilicon material, a second switching region comprising the amorphous silicon material, and a third wiring structure. The third wiring structure is separated from the second wiring structure and spatially parallel to the second wiring structure in a specific embodiment. In a specific embodiment, a dielectric material is disposed at least in a region between the first switching region and the second switching region to electrically and physically isolate at least the first switching region from the second switching region. The dielectric material prevents cross talk and disturbs between the first cell and the second cell when one of the cells is selected in each of the programming, writing, reading or erase cycles as illustrated in FIGS. 13 and 16.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method of forming a non volatile memory device, comprising:
    providing a substrate having a surface region;
    forming a first dielectric material overlying the surface region of the semiconductor substrate;
    forming a first wiring material overlying the first dielectric material;
    forming a contact material comprising a doped polysilicon material overlying the first wiring material;
    forming a switching material comprising an amorphous silicon material overlying the contact material;
    subjecting the switching material to a first patterning and etching process, separating a first strip of switching material from a second strip of switching material, the first strip of switching material and the second strip of switching material being spatially oriented in a first direction; and
    subjecting the first strip of switching material, the second strip of switching material, the contact material, and the first wiring material to a second patterning and etching process, forming at least a first switching element from the first strip of switching material and at least a second switching element from the second strip of switching material, and a first wiring structure comprising at least the first wiring material and the contact material, the first wiring structure being extended in a second direction at an angle to the first direction.

2. The method of claim 1 further comprising:
    depositing a thickness of second dielectric material overlying each of the first switching element and the second switching element, the second dielectric material filling a void region caused by the first patterning and etching process and the second patterning and etching process to isolated at least the first switching element from the second switching element in the second direction;
    forming an opening region in a portion of the thickness of the second dielectric material to expose a surface region of each of the first switching element, the second switching element, the third switching element, and the fourth switching element;
    depositing a second wiring material including a conductive material overlying the second dielectric material, the conductive material filling the opening region and in contact with the switching material; and
    subjecting the second wiring material to a third etching process to form a second wiring structure overlying the switching element, the second wiring structure being spatially parallel to the first direction.

3. The method of claim 1 wherein the second etching process further removes a portion of the contact material and the first wiring material to form a first wiring structure disposed in the first direction.

4. The method of claim 1 further comprises forming a third dielectric material to isolate the second wiring structure.

5. The method of claim 1 wherein the second dielectric material isolates the first switching element associated with a first switching device from a second switching element associated with a second switching device in the first direction, preventing disturb between the first switching device and the second switching device during writing, reading, or erasing.

6. The method of claim 1 wherein the substrate comprises a semiconductor substrate such as single silicon, silicon germanium, or silicon on insulator.

7. The method of claim 1 wherein the semiconductor substrate comprises one or more transistor devices formed thereon, the one or more transistor devices being operable coupled to the memory device.

8. The method of claim 1 wherein the first dielectric material comprises silicon oxide, silicon nitride, or a silicon oxide on silicon nitride on silicon oxide (ONO) stack.

9. The method of claim 1 wherein the first wiring material comprises copper, tungsten, or aluminum.

10. The method of claim 1 wherein the contact material prevents an interfacial region to form from the switching material and the first wiring material.

11. The method of claim 1 wherein the contact material is optional.

12. The method of claim 1 wherein the second dielectric material comprises silicon oxide, silicon nitride, or a silicon oxide on silicon nitride on silicon oxide (ONO) stack.

13. The method of claim 1 wherein the conductive material is selected from silver, gold, platinum, palladium, aluminum, and zinc, including combinations thereof.

14. The method of claim 1 wherein the conductor material forms a metal region comprising the conductive material in a portion of the switching material upon application of a voltage coupled to the first wiring structure or the second wiring structure.

15. The method of claim 14 wherein the voltage is a positive voltage applied to the second wiring structure with respect to the first wiring structure.

16. The method of claim 14 wherein the metal region comprises a plurality of metal particles, the metal particles includes clusters, ions, the metal region further comprises a filament structure characterized by a length and a distance between metal particles.

17. A method of forming a disturb-resistant non volatile memory device, comprising:

providing a first cell and a second cell, the first cell being formed from a first wiring structure extending in a first direction and a second wiring structure extending in a second direction orthogonal to the first direction, a switching material comprising an amorphous silicon material, and a contact material comprising a p+ polysilicon material, a first switching region formed in an intersecting region between the first wiring structure and the second wiring structure, the second cell being formed from the first wiring structure, the switching material, the contact material, and a third wiring structure, the third wiring structure being parallel to the second wiring structure, a second switching region being formed in an intersecting region between the first wiring structure and the third wiring structure, at least the switching material and the contact material forming a coupling between the first cell and the second cell;

eliminating the coupling by removing a portion of the switching material to form a void region between the first switching region and the second switching region; and filling the void region using a dielectric material to electrically and physically isolate the first switching region and the second switching region.

18. The method of claim 17 wherein the first cell and the second cell are provided in an N by M interconnected crossbar array.

19. The method of claim 17 wherein the eliminating the coupling further removes a portion of the contact material to form a first void region between the first contact region and the second contact region, and filling the void region and the first void region using the dielectric material to physically isolate the first switching region and the second switching region and to physically isolate the first contact region and the second contact region.

* * * * *